United States Patent
Kim et al.

(10) Patent No.: US 8,242,504 B2
(45) Date of Patent: Aug. 14, 2012

(54) OXIDE SEMICONDUCTOR AND THIN FILM TRANSISTOR INCLUDING THE SAME

(75) Inventors: Changjung Kim, Yongin-si (KR); Sangwook Kim, Yongin-si (KR); Sunil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 12/453,977

(22) Filed: May 28, 2009

(65) Prior Publication Data

US 2010/0025674 A1    Feb. 4, 2010

(30) Foreign Application Priority Data

Jul. 31, 2008    (KR) .......................... 10-2008-0075349

(51) Int. Cl.
*H01L 29/26*    (2006.01)
(52) U.S. Cl. ................... 257/66; 257/E21.414

(58) Field of Classification Search ............ 257/43, 257/57, E29.079, E29.273, 66, E21.411, 257/E29.296, E21.414
See application file for complete search history.

(56) References Cited

U.S. PATENT DOCUMENTS

| | | |
|---|---|---|
| 2005/0062134 A1 | 3/2005 | Ho et al. |
| 2007/0194379 A1 | 8/2007 | Hosono et al. |
| 2009/0008638 A1* | 1/2009 | Kang et al. ............ 257/43 |

FOREIGN PATENT DOCUMENTS

JP    2007-073705    3/2007

* cited by examiner

*Primary Examiner* — Minh-Loan T Tran
*Assistant Examiner* — Fazli Erdem
(74) *Attorney, Agent, or Firm* — Harness, Dickey & Pierce, P.L.C.

(57) ABSTRACT

An oxide semiconductor and a thin film transistor (TFT) including the same. The oxide semiconductor may be obtained by adding hafnium (Hf) to gallium-indium-zinc oxide (GIZO) and may be used as a channel material of the TFT.

20 Claims, 5 Drawing Sheets

OXIDE SEMICONDUCTOR AND THIN FILM TRANSISTOR INCLUDING THE SAME

PRIORITY STATEMENT

This application claims the benefit of Korean Patent Application No. 10-2008-0075349, filed on Jul. 31, 2008, in the Korean Intellectual Property Office, the entire contents of which is incorporated herein in its entirety by reference.

BACKGROUND

1. Field

Example embodiments relate to an oxide semiconductor and a thin film transistor (TFT) including the same, and more particularly, to an oxide semiconductor obtained by adding a new material to gallium-indium-zinc oxide (GIZO) and a TFT including the same.

2. Description of the Related Art

Thin film transistors (TFTs) may be used in various application fields and, particularly, may be used as switching and driving devices of display apparatuses and as selection switches of cross-point type memory devices.

While liquid crystal display (LCD) apparatuses may be mainly used as display panels in televisions (TVs), a vast amount of research on organic light-emitting display (OLED) apparatuses that may also be applied to TVs is being conducted. TV display technologies may be developed according to demands of the market. Market demands may include demand for: large-scaled TVs or digital information display (DID) apparatuses, low price, and high definition (high resolution, excellent color rendition, brightness, contrast characteristics, and high color reproducibility), etc. In order to satisfy these demands, substrates such as glass substrates may be required to become larger and TFTs to be used as switching and driving devices of display apparatuses may be required to have high performance.

An example of a TFT used as a switching or driving device of a display apparatus may be an amorphous silicon (a-Si) TFT which may be uniformly formed on a large substrate over 2 meters (m) in length at a low cost, and may the most widely used TFT. However, TFTs may be required to have high performance as display apparatuses require high-definition characteristics and large sizes, and thus the display apparatuses may be regarded as being limited by the operating capabilities of typical a-Si TFTs having a mobility of about 0.5 cm2/Vs. Thus, a high-performance TFT having a higher mobility than an a-Si TFT, and a technology of manufacturing the high-performance TFT may be required.

A polysilicon (poly-Si) TFT, having a much higher performance than an a-Si TFT may have a mobility of several tens to several hundred cm2/Vs. Thus a poly-Si TFT may have a sufficiently high performance to be applied to high-definition display apparatuses that are not easily implemented by using a-Si TFTs. Also, poly-Si TFTs have less device characteristic deterioration than a-Si TFTs. However, the process of manufacturing poly-Si TFTs may be more complicated than that of a-Si TFTs, and thus additional costs may increase. Thus, although a poly-Si TFT may be appropriately applied to a high-definition display apparatus or an OLED apparatus, application of poly-Si TFTs may be limited due to higher costs than a-Si TFTs. Also, poly-Si TFTs have not been implemented on large substrates over 1 m in length until now due to, for example, manufacturing equipment limitations or uniformity defects. As a result, poly-Si TFTs may not be easily applied to TV products.

Accordingly, a new TFT having advantages of both a-Si TFTs and poly-Si TFTs may be required, and research is being actively conducted into such a new TFT. A representative example of such a device may be an oxide semiconductor device.

Among oxide semiconductor devices, zinc oxide (ZnO)-based TFTs are currently attracting attention. Until now, ZnO-based materials such as ZnO, indium-zinc oxide (IZO), and ZnO or IZO in which, for example, gallium (Ga), magnesium (Mg), aluminum (Al), or iron (Fe) may be doped have been introduced. A ZnO-based semiconductor device may be manufactured through a low-temperature process and has an. amorphous phase, and thus may be easily implemented on a large substrate. Also, a ZnO-based TFT has high mobility and an excellent electric characteristic like the poly-Si TFT. Currently, research is being conducted in order to use an oxide semiconductor material layer having a high mobility, in particular, a ZnO-based material layer in a channel area of a TFT.

SUMMARY

Example embodiments may include an oxide semiconductor obtained by adding another material, for example, hafnium (Hf)l to gallium-indium-zinc oxide (GIZO).

Example embodiments may include an oxide thin film transistor (TFT) in which the oxide semiconductor may be used in a channel area.

According to an example embodiment, the composition ratio of Hf to a total content of gallium (Ga), indium (In), zinc (Zn), may be 0 at %<Hf(at %)≦10 at %.

According to an example embodiment, the oxide semiconductor may be amorphous, partially crystalline, or crystalline.

According to an example embodiment, the oxide semiconductor may further include a Group I element, a Group II element, a Group m element, a Group IV element, a Group V element, or a lanthanoid (Ln)-based element.

Example embodiments may include an oxide thin film transistor (TFT) including a gate; a channel which is formed so as to correspond to the gate and includes an oxide semiconductor obtained by adding hafnium (Hf) to gallium-indium-zinc oxide (GIZO); a gate insulating layer which is formed between the gate and the channel; and a source and a drain which are formed so as to contact both sides of the channel, respectively.

According to an example embodiment, in the oxide semiconductor, a composition ratio of Hf to a total content of gallium (Ga), indium (In), zinc (Zn), and Hf may be 0 at %<Hf(at %)≦10 at %.

According to an example embodiment, the oxide semiconductor may be amorphous, partially crystalline, or crystalline.

According to an example embodiment, the oxide semiconductor may further include a Group I element, a Group II element, a Group III element, a Group IV element, a Group V element, or a lanthanoid (Ln)-based element.

BRIEF DESCRIPTION OF THE DRAWINGS

The above and other features and advantages will become more apparent by describing in detail example embodiments thereof with reference to the attached drawings in which.

DETAILED DESCRIPTION OF EXAMPLE EMBODIMENTS

Figure 1A:
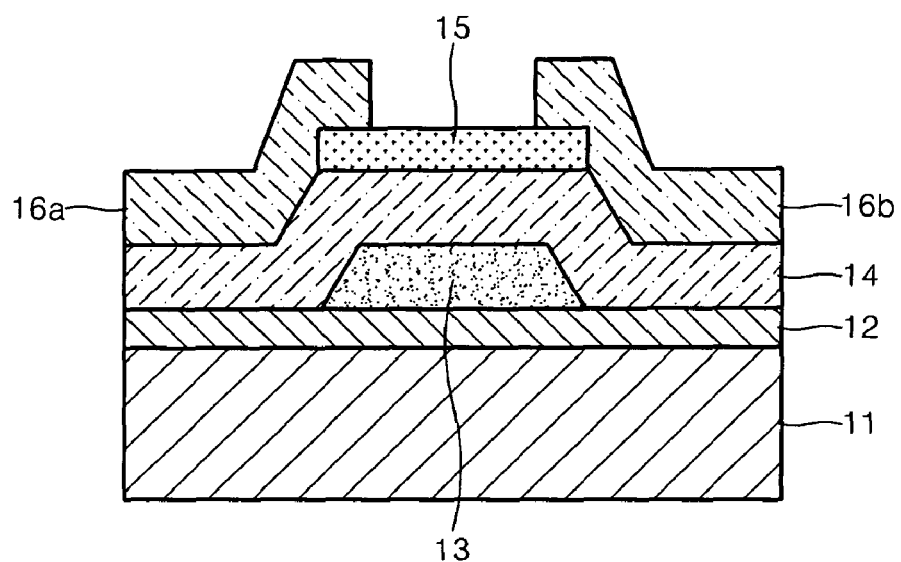
FIGS. 1A and 1B are cross-sectional views of thin film transistors (TFTs), each including an oxide semiconductor, according to example embodiments.

Example embodiments will now be described more fully with reference to the accompanying drawings, in which example embodiments are shown. Example embodiments may, however, be embodied in many different forms and should not be construed as being limited to the example embodiments set forth herein; rather, example embodiments are provided so that this disclosure will be thorough and complete, and will fully convey example embodiments to those skilled in the art. Like reference numerals in the drawings denote like elements, and thus, their description may not be repeated.

Example embodiments will be more clearly understood from the detailed description taken in conjunction with the accompanying drawings.

In the drawings, the thicknesses of layers and regions may be exaggerated for clarity.

Example embodiments are disclosed herein. However, specific structural and functional details disclosed herein are merely representative for purposes of describing example embodiments. However, example embodiments may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise.

It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

In the figures, if a layer is formed on another layer or a substrate, it means that the layer is directly formed on another layer or a substrate, or that a third layer is interposed there between. In the following description, the same reference numerals denote the same elements.

Although example embodiments have been disclosed for illustrative purposes, those skilled in the art will appreciate that various modifications, additions and substitutions are possible, without departing from the scope and spirit of the invention as disclosed in the accompanying claims.

An oxide semiconductor according to example embodiments may be formed by adding hafnium (Hf) to gallium-indium-zinc oxide (GIZO). GIZO may include, for example, at least gallium (Ga), indium (In), and zinc (Zn) and each of Ga, In, and Zn may be bonded with oxygen (O) as in gallium oxide ($Ga_2O_3$), indium oxide ($In_2O_3$), and zinc oxide (ZnO), or a mixture of two or three of Ga, In, and Zn may share O. Hf added to GIZO may also be bonded with O as in $HfO_2$, or may share O with one of or a mixture of two or three of Ga, In, and Zn.

The oxide semiconductor formed by adding Hf to GIZO may be amorphous, partially crystalline, or crystalline.

An electro-negativity difference between Hf having an electro-negativity of 1.3 and O having an electro-egativity of 3.5 is 2.2, and thus an oxide including Hf and O may be formed in a strong ionic bond. An ionic radius of Hf is 0.078 nm and may be similar to the ionic radius of Zn, which is 0.074 nm. Thus, for example, if Hf is added to GIZO, Zn may be easily replaced by Hf without transforming a crystal lattice.

Hydrogenated amorphous silicon (a-Si:H) forms a covalent bond. For example, in a covalent bond, if an sp3 coordinate bond is formed with directivity so as to be amorphous, an electron cloud forming an oxygen bond may be distorted. Accordingly, a weak bond may be formed. If a thin film transistor (TFT) having the above bonding structure may be driven for a long time, electrons or holes may be accumulated in a bonding area. As a result, the bond may be broken and a threshold voltage Vth may vary, thereby causing reliability problems. Alternatively, in an ionic bond, cations may form a large electron cloud so as to overlap each other regardless of a bond of O anions, a weak bond does not exist regardless of a crystalline or amorphous phase, and thus threshold voltage Vth variation hardly exists or may be very small. Thus, ionic bonds may be regarded as contributing to the manufacture of highly reliable TFTs. According to an example embodiment, transistor characteristics may be easily controlled due to the above described ionic bond formed in most parts of GIZO to which Hf may be added. However, all bonds do not need to be ionic bonds.

According to an example embodiment, a composition ratio of Hf with respect to a total content of Ga, In, Zn, and Hf in the oxide semiconductor may be 0 at %<Hf(at %)≦10 at %. Alternatively, the composition ratio of Hf may be 0 at %<Hf (at %)≦6.45 at %, or 2.68 at %≦Hf(at %)≦5.16 at %.

Group I elements such as lithium (Li) and potassium (K); Group II elements such as magnesium (Mg), calcium (Ca), and strontium (Sr); Group III elements such as gallium (Ga), aluminum (Al), In, and yttrium (Y); Group IV elements such as titanium (Ti), zirconium (Zr), silicon (Si), tin (Sn), and germanium (Ge); Group V elements such as tantalum (Ta), vanadium (V), niobium (Nb), and antimony (Sb); and lanthanoid (Ln)-based elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu) may be additionally included in the oxide semiconductor according to example embodiments.

The oxide semiconductor according to example embodiments may be used as: a channel material of a driving transistor of a liquid crystal display (LCD) apparatus, an organic light-emitting display (OLED) apparatus, a channel material of a selection transistor, or a transistor forming a peripheral circuit of a memory device.

Figure 1B:
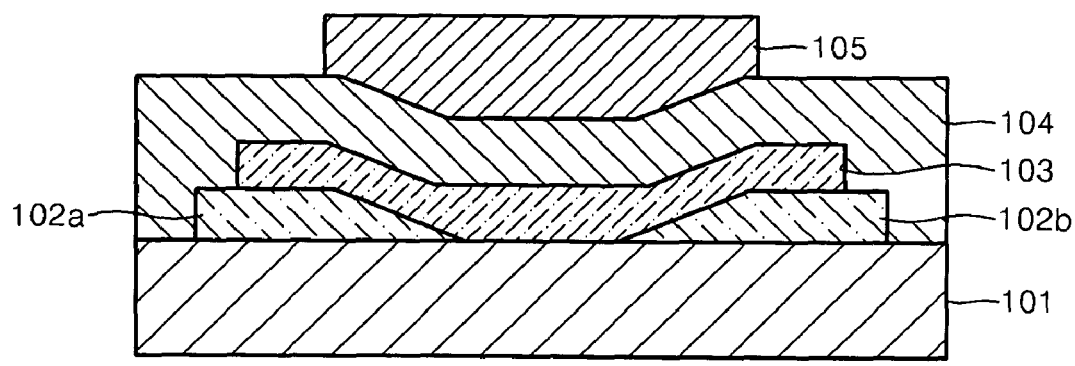

FIGS. 1A and 1B are cross-sectional views of TFTs each including an oxide semiconductor, according to example embodiments. FIG. 1A illustrates a bottom gate TFT and FIG. 1B illustrates a top gate TFT. Hereinafter, a TFT including an oxide semiconductor may be referred to as an oxide TFT.

Referring to FIG. 1A, an oxide TFT according to an example embodiment may include a gate 13 formed on a portion of a substrate 11, and a gate insulating layer 14 may be formed on the substrate 11 and the gate 13. The substrate 11 may be formed of Si. For example, if the substrate 11 is formed of Si, an oxide layer 12 may be further formed on a surface of the substrate 11 through a thermal oxidation process. A channel 15 may be formed on a portion of the gate insulating layer 14 corresponding to the gate 13, and a source 16a and a drain 16b are separately formed at each side of the channel 15 on the gate insulating layer 14, respectively.

Referring to FIG. 1B, an oxide TFT according to an example embodiment may include a source 102a and a drain 102b formed on a substrate 101, and a channel 103 may be formed between the source 102a and drain 102b. A gate insulating layer 104 may be formed on the channel 103 and the substrate 101, and a gate 105 may be formed on the portion of the gate insulating layer 104 corresponding to the channel 103. For example, if the substrate 101 is formed of Si, an oxide layer (not shown) may be further formed on a surface of the substrate 101 through a thermal oxidation process.

Materials forming the layers of the oxide TFTs illustrated in FIGS. 1A and 1B will now be described.

The substrates 11 and 101 may be formed of a material that may be used in general semiconductor devices, for example, Si, glass, or an organic material. The oxide layer 12 formed on the substrate 11 may be a silicon oxide (SiO2) layer formed by performing a thermal oxidation process on a silicon substrate. The gates 13 and 105 may be formed of a conductive material, for example, a metal such as Ti, platinum (Pt), ruthenium (Ru), gold (Au), silver (Ag), molybdenum (Mo), Al, tungsten (W), or copper (Cu), or a conductive oxide such as indium-zinc oxide (IZO) or aluminum-zinc oxide (AZO). The gate insulating layers 14 and 104 may be formed of an insulating material that may be used in general semiconductor devices, for example, SiO2, a high-K material such as hafnium oxide (HfO2), aluminum oxide (Al2O3), and/or silicon nitride (Si3N4) having a higher dielectric constant than SiO2, or a mixture thereof. The sources, 16a and 102a, and drains, 16b and 102b, may be formed of a conductive material, for example, a metal such as Ti, Pt, Ru, Au, Ag, Mo, Al, W, or Cu, or a conductive oxide such as IZO or AZO.

FIGS. 2A through 2E are diagrams illustrating a method of manufacturing an oxide TFT, according to an example embodiment.

Figure 2A:
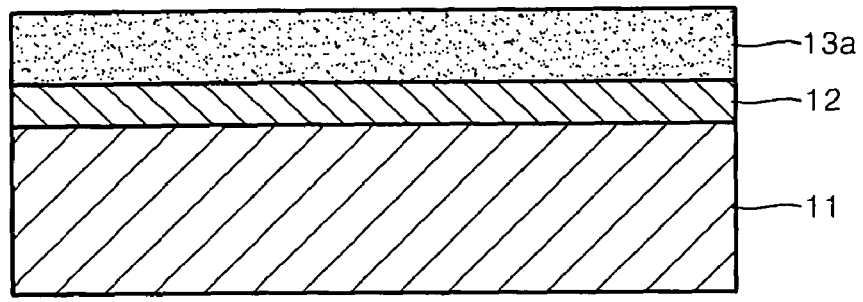
FIGS. 2A through 2E are diagrams illustrating a method of manufacturing an oxide TFT, according to an example embodiment.

Referring to FIG. 2A, initially, a substrate 11 may be prepared. The substrate 11 may be formed of Si, glass, or an organic material. Here, if the substrate 11 is formed of Si, an oxide layer 12 may be formed on a surface of the substrate 11 through a thermal oxidation process. Also, a conductive material 13a such as a metal or a conductive metal oxide is coated on the substrate 11.

Figure 2B:
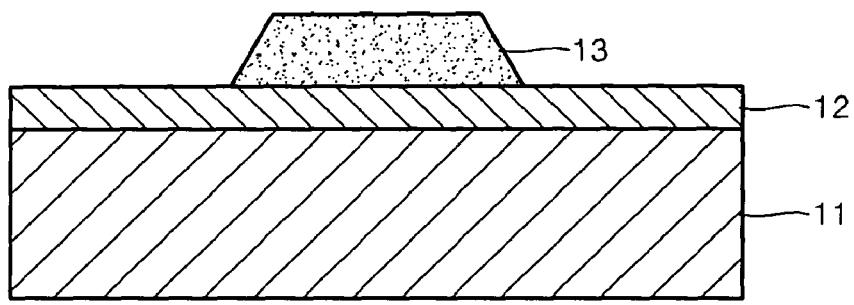
Figure 2C:
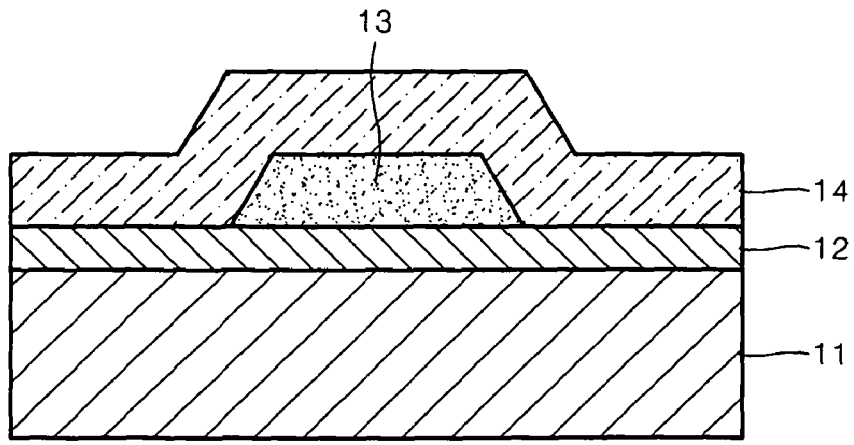

Referring to FIG. 2B, a gate 13 may be formed by patterning the conductive material 13a. Referring to FIG. 2C, a gate insulating layer 14 may be formed by coating an insulating material on the gate 13 and patterning the insulating material. The gate insulating layer 14 may be formed of SiO2, Si3N4, HfO2, Al2O3, or a mixture of HfO2 and Al2O3.

Figure 2D:
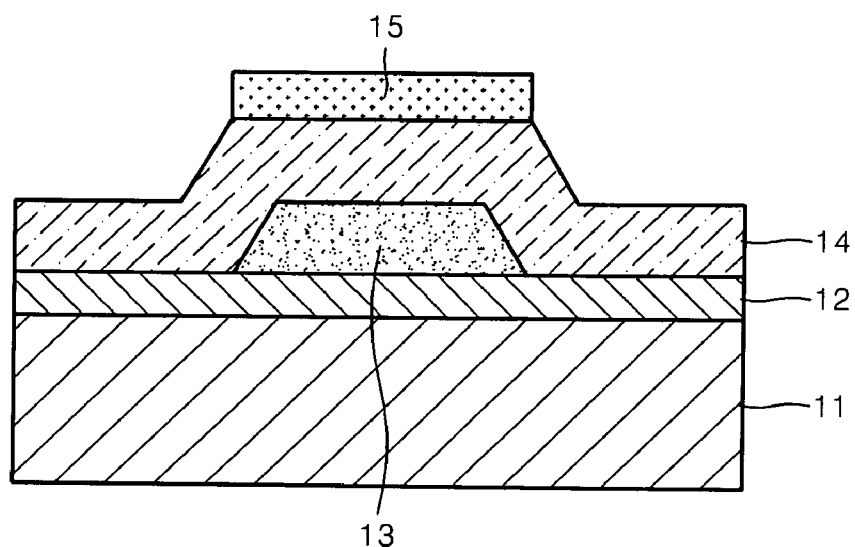

Referring to FIG. 2D, a channel 15 may be formed by coating a channel material on the gate insulting layer 14 through, for example, a physical vapor deposition (PVD) process, a chemical vapor deposition (CVD) process, or an atomic layer deposition (ALD) process, and patterning the channel material so as to retain the channel material on a portion of the gate insulting layer 14 corresponding to the gate 13. According to an example embodiment, the channel 15 may be formed by adding Hf to GIZO. For example, if the channel 15 is formed through a sputtering process, a target formed of GIZO and a target formed of Hf may be placed into a process chamber and then the channel 15 may be formed through a co-sputtering process. Alternatively, a single target in which Hf is added to GIZO may be used.

Figure 2E:
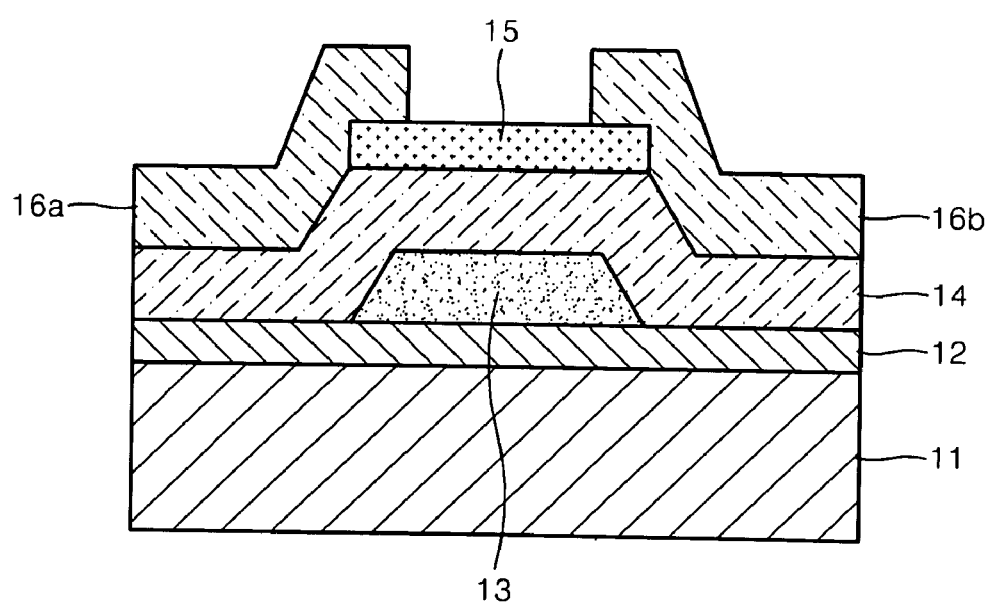

Referring to FIG. 2E, a conductive material such as a metal or a conductive metal oxide may be coated on the channel 15 and the gate insulating layer 14, and the conductive material may be patterned so to form a source 16a and a drain 16b connected to each side of the channel 15, respectively. Lastly, a heat treatment process may be performed at a temperature of 400° C. or less, for example, about 200° C., by using: a general furnace annealing method, a rapid thermal annealing method, a laser annealing method, a hot plate annealing method, or a similar method.

MANUFACTURING EXAMPLE

A substrate including a SiO2 layer may be formed to a thickness of 100 nm on a surface of a silicon substrate. A gate formed of Mo may be formed to a thickness of 200 nm on a portion of a surface of the substrate, and then a gate insulating layer may be formed on the substrate and the gate by coating Si3N4 to a thickness of 200 nm on the substrate and the gate. Next, a channel may be formed by coating an oxide semiconductor on a portion of the gate insulating layer corresponding to the gate. An example detailed process of forming the channel may be as described below. For example, a 99% GIZO target having a composition ratio of Ga2O3: In2O3: ZnO=1:1:1 mol and a 99% Hf target may be used. For instance, these targets may be placed into a chamber of a sputtering apparatus (model: MS100). At room temperature, a gas containing O2 and argon (Ar) gas may be supplied in a ratio of O2:Ar=5:95 vol % and the pressure of the O2 and Ar gas may be maintained at 5 mTorr. Also, for example, a co-sputtering process may be performed by supplying power of 150 W to the GIZO target and supplying power of 15~30W to the Hf target. Thus, a channel having a thickness of about 70 nm may be formed by coating an oxide semiconductor thin film including GIZO and Hf on the gate insulating layer. Next, for example, a source and a drain, each having a thickness of 200 nm and formed of Mo, may be formed at both sides of the channel. Further, a heat treatment process may be performed at 200° C. for one hour.

Accordingly, an oxide semiconductor according to an example embodiment may be formed and a gate voltage Vg and a drain current Id of the oxide semiconductor may be measured.

Figure 3:
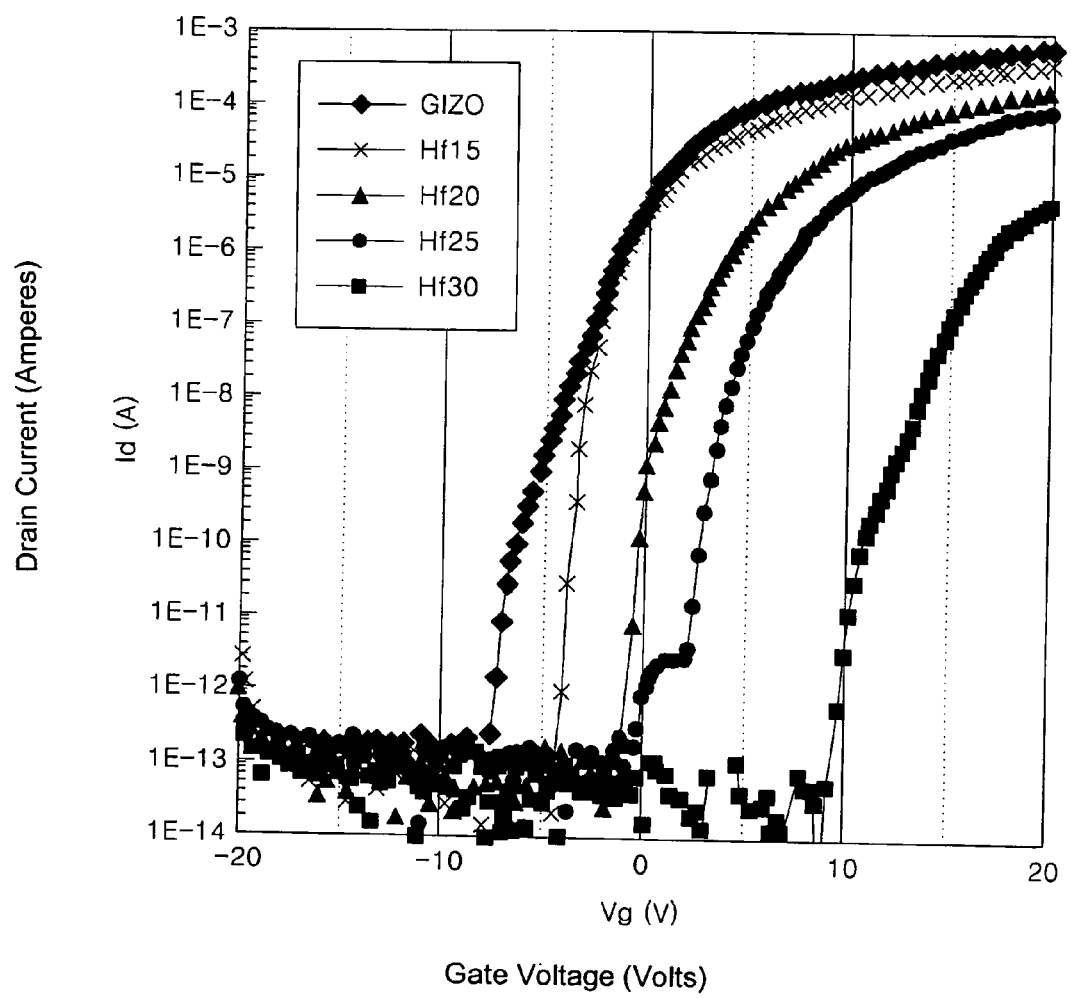
FIG. 3 is a graph showing a correlation between a gate voltage Vg and a drain current Id of an oxide TFT including gallium-indium-zinc oxide (GIZO) and hafnium (Hf) as a channel material, according to an example embodiment.

FIG. 3 is a graph showing a correlation between a gate voltage Vg and a drain current Id of an oxide TFT including GIZO and Hf as a channel material, according to an example embodiment. In FIG. 3, in order to control the content of Hf when a channel of the oxide TFT may be formed by performing a co-sputtering process, power supplied to the GIZO target may be fixed and only a deposition power of an Hf target may be controlled. For example, variations in the gate voltage Vg and the drain current Id with respect to a sample formed by not including Hf and samples formed by supplying power of 15 W, 20 W, 25 W, and 30 W to the Hf target are illustrated in the graph.

Referring to FIG. 3, for example, as the content of Hf in GIZO increases, an initial V on moves from about −8 V toward the right, and V on when 30 W is supplied to the Hf target is about 10V. Also, a sample formed by supplying 15 W to the Hf target has a voltage swing (S.S) of 181 mV/dec and has a channel mobility of about 6.5 cm2/Vs. In all of the samples, for example, an off current I of f is equal to or less than 10 pA and thus an on-off current ratio Ion/Ioff is equal to or greater than 107.

An inductively coupled plasma (ICP)-auger electron spectroscopy (AES) analysis may be performed in order to check compositions of oxide semiconductor materials of the above samples.

For example, a sequential spectrometer ( may be used as an analyzer. Analysis results, for example, of compositions of Ga, In, Zn, and Hf of each sample are shown in Table 1.

TABLE 1

| Sample | Ga/(Ga + In + Zn + Hf) (at %) | In/(Ga + In + Zn + Hf) (at %) | Zn/(Ga + In + Zn + Hf) (at %) | Hf/(Ga + In + Zn + Hf) (at %) |
|---|---|---|---|---|
| GIZO | 42.4 | 43.7 | 13.9 | 0 |
| GIZO + Hf 15 W | 41 | 43.4 | 13.0 | 2.68 |
| GIZO + Hf 20 W | 40.5 | 42.9 | 12.6 | 3.87 |
| GIZO + Hf 25 W | 39.8 | 42.8 | 12.3 | 5.16 |
| GIZO + Hf 30 W | 39.4 | 42.2 | 12.0 | 6.45 |

※ Error Range: ±1%

Referring to Table 1, as power supplied to the Hf target increases, the content of Hf increases. For example, when the power supplied to the Hf target increases to 30 W, the composition ratio of Hf is 0 at %<Hf(at %)≦6.45 at %, the composition ratio of Ga is 39.4 at % ≦Ga(at %)<42.4 at %, the composition ratio of In is 42.2 at %≦In(at %)<43.7 at %, and the composition ratio of Zn is 12.0 at %≦Zn(at %)<13.9 at %.

Figure 4:
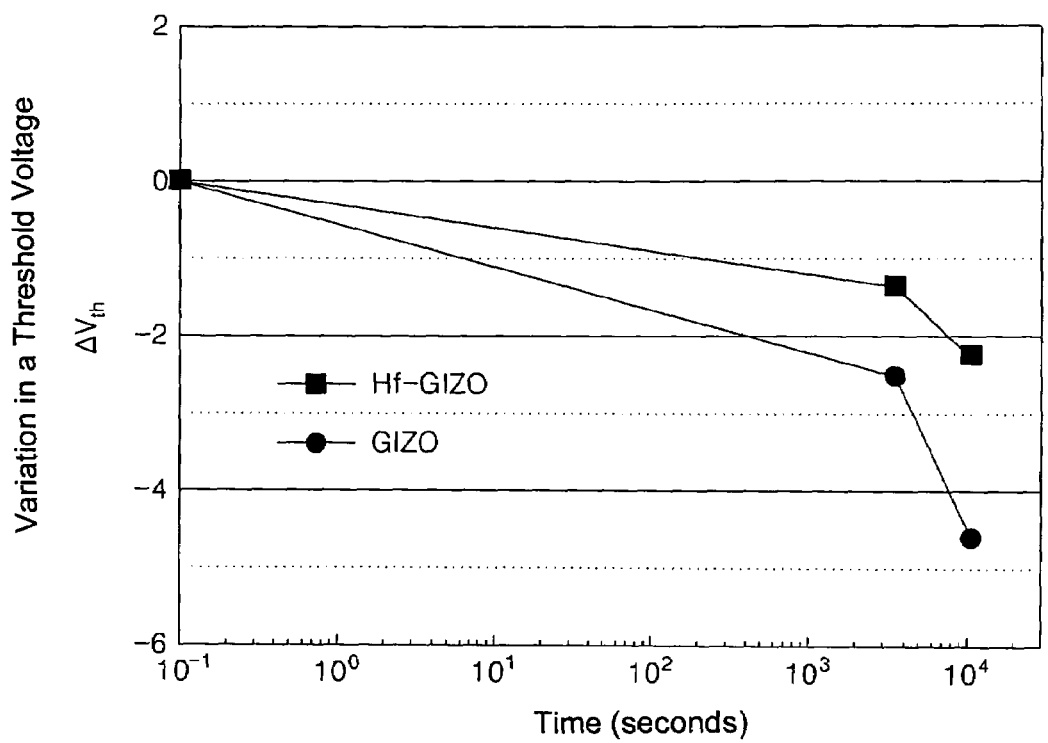
FIG. 4 is a graph of a variation in a threshold voltage Vth according to time when a constant voltage is applied to an oxide TFT including GIZO and Hf as a channel material, according to an example embodiment.

FIG. 4 is a graph of a variation ΔVth in a threshold voltage Vth according to time when a constant voltage is applied to an oxide TFT including GIZO and Hf as a channel material, according to an example embodiment. For example, a sample including only GIZO as a channel material, and a sample obtained by supplying a power of 20 W to an Hf target so as to add Hf to GIZO and to form a channel, and then performing a heat treatment process at about 250° C., may be used. A constant voltage test may be performed by applying a gate voltage Vg of −20 V and a drain voltage Vd of about 10 V for a predetermined time at about 60° C. and measuring the variation ΔVth in the threshold voltage Vth of the oxide TFT according to time.

Referring to FIG. 4, for example, after the constant voltage test may be performed for about three hours, the threshold voltage Vth of the sample not including Hf may vary by 4.8V while the threshold voltage $V_{th}$ of the sample including Hf may vary by only 2.1V. Thus, the constant voltage test verifies that the variation $\Delta V_{th}$ in the threshold voltage $V_{th}$ may be reduced by adding Hf as a channel material.

A composition ratio, a characteristic graph, mobility characteristics, etc. of a deposited thin film may be changed according to, for example: the type of a target, a voltage applied to the target during deposition, deposition equipment, a deposition pressure, an oxygen partial pressure condition, or the temperature of a substrate. For example, a thin film deposited by using two targets, such as a GIZO target and an Hf target, may have a different composition ratio from a thin film deposited by using a single target such as a hafnium-gallium-indium-zinc (HfGaInZn) oxide target. Also, even if the composition ratios are the same, thin films may have different characteristics according to deposition conditions. For example, if an oxide semiconductor is deposited through a sputtering process, a resistance range of an oxide may greatly vary according to an oxygen partial pressure. A thin film having a low resistance may be deposited if the oxygen partial pressure is controlled below an appropriate level, and a thin film having a high resistance may be deposited if the oxygen partial pressure is controlled to be high.

According to example embodiments, one skilled in the art may manufacture various electronic devices, including: a driving transistor of a flat panel display apparatus, an LCD apparatus, an OLED apparatus, or a transistor for forming a peripheral circuit of a memory device, by using an oxide semiconductor based on example embodiments. Moreover, an oxide TFT according to an example embodiment may be used as a bottom gate TFT or a top gate TFT.

While example embodiments have been particularly shown and described with reference to FIGS. 1-4, it will be understood by one of ordinary skill in the art that various changes in form and details may be made therein without departing from the spirit and scope of example embodiments, as defined by the following claims.

What is claimed is:

1. An oxide semiconductor obtained by adding hafnium (Hf) to gallium-indium-zinc oxide (GIZO), wherein a composition ratio of Hf with respect to a total content of gallium (Ga), indium (In), zinc (Zn), and Hf is 0 at %<Hf(at %)≦10 at %.

2. The oxide semiconductor of claim 1, wherein a composition ratio of Hf with respect to a total content of Ga, In, Zn, and Hf is 0 at %<Hf(at %)≦6.45 at %.

3. The oxide semiconductor of claim 1, wherein a composition ratio of Hf with respect to a total content of Ga, In, Zn, and Hf is 2.68 at %≦Hf(at %)≦5.16 at %.

4. The oxide semiconductor of claim 2, wherein a composition ratio of Ga with respect to a total content of Ga, In, Zn, and Hf is 39.4 at %≦Ga(at %)≦42.4 at %.

5. The oxide semiconductor of claim 2, wherein a composition ratio of In with respect to a total content of Ga, In, Zn, and Hf is 42.2 at %≦In(at %)<43.7 at %.

6. The oxide semiconductor of claim 2, wherein a composition ratio of Zn with respect to a total content of Ga, In, Zn, and Hf is 12.0 at %≦Zn (at %)<13.9 at %.

7. The oxide semiconductor of claim 1, further comprising a Group I element, a Group II element, a Group III element, a Group IV element, a Group V element, or a lanthanoid (Ln)-based element.

8. The oxide semiconductor of claim 1, wherein the oxide semiconductor is amorphous.

9. The oxide semiconductor of claim 1, wherein the oxide semiconductor is partially crystalline.

10. The oxide semiconductor of claim 1, wherein the oxide semiconductor is crystalline.

11. An oxide thin film transistor (TFT) comprising:
a gate;
a channel which is formed so as to correspond to the gate and comprises an oxide semiconductor obtained by adding hafnium (Hf) to gallium-indium-zinc oxide (GIZO), wherein a composition ratio of Hf with respect to a total content of gallium (Ga), indium (In), zinc (Zn), and Hf is 0 at %<Hf(at %)≦10 at %;
a gate insulating layer which is formed between the gate and the channel; and
a source and a drain which are formed so as to contact both sides of the channel, respectively.

12. The oxide TFT of claim 11, wherein a composition ratio of Hf with respect to a total content of Ga, In, Zn, and Hf in the oxide semiconductor is 0at %<Hf(at %)≦6.45 at %.

13. The oxide TFT of claim 11, wherein a composition ratio of Hf with respect to a total content of Ga, In, Zn, and Hf in the oxide semiconductor is 2.68 at %≦Hf(at %)≦5.16 at %.

14. The oxide TFT of claim 12, wherein a composition ratio of Ga with respect to a total content of Ga, In, Zn, and Hf is 39.4 at %≦Ga(at %)<42.4 at %.

15. The oxide TFT of claim 12, wherein a composition ratio of In with respect to a total content of Ga, In, Zn, and Hf is 42.2 at %≦In (at %)<43.7 at %.

16. The oxide TFT of claim 12, wherein a composition ratio of Zn with respect to a total content of Ga, In, Zn, and Hf is 12.0 at %≦Zn (at %)<13.9 at %.

17. The oxide TFT of claim 11, wherein the channel further comprises a Group I element, a Group II element, a Group III element, a Group IV element, a Group V element, or a lanthanoid (Ln)-based element.

18. The oxide TFT of claim 11, wherein the oxide semiconductor is amorphous.

19. The oxide TFT of claim 11, wherein the oxide semiconductor is partially crystalline.

20. The oxide TFT of claim 11, wherein the oxide semiconductor is crystalline.

* * * * *